United States Patent
Saito

(12) 
(10) Patent No.: US 11,090,921 B2
(45) Date of Patent: Aug. 17, 2021

(54) PEELING METHOD OF RESIN SHEET

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/984,350

(22) Filed: Aug. 4, 2020

(65) Prior Publication Data

US 2021/0039377 A1 Feb. 11, 2021

(30) Foreign Application Priority Data

Aug. 9, 2019 (JP) .............................. JP2019-147654

(51) Int. Cl.
*B32B 43/00* (2006.01)
*B32B 27/06* (2006.01)
*H01L 21/683* (2006.01)
*B32B 38/10* (2006.01)

(52) U.S. Cl.
CPC ............ *B32B 43/006* (2013.01); *B32B 27/06* (2013.01); *B32B 38/10* (2013.01); *H01L 21/6836* (2013.01); *Y10T 156/1153* (2015.01); *Y10T 156/1911* (2015.01)

(58) Field of Classification Search
CPC . B32B 38/10; B32B 43/006; Y10T 156/1153; Y10T 156/1911
See application file for complete search history.

(56) References Cited

U.S. PATENT DOCUMENTS

| | | | | |
|---|---|---|---|---|
| 2010/0038035 A1* | 2/2010 | Noda | .................... | B32B 43/006 156/379.6 |
| 2010/0243159 A1* | 9/2010 | Nishio | .................. | B32B 27/281 156/712 |
| 2011/0048641 A1* | 3/2011 | Sugimura | ............... | B32B 38/10 156/705 |
| 2015/0301500 A1* | 10/2015 | Fickes | .................... | B32B 27/14 359/2 |

FOREIGN PATENT DOCUMENTS

JP 2012028478 A 2/2012

* cited by examiner

*Primary Examiner* — Mark A Osele
*Assistant Examiner* — Nickolas R Harm
(74) *Attorney, Agent, or Firm* — Greer, Burns & Crain, Ltd.

(57) ABSTRACT

There is provided a peeling method of a resin sheet for peeling off the resin sheet from a plate-shaped object to which the resin sheet is stuck. The peeling method includes a resin sheet heating step of heating an end part of the resin sheet of the plate-shaped object to which the resin sheet is stuck to turn up the resin sheet from the end part and form a peeling origin point and a resin sheet removal step of removing the resin sheet from the plate-shaped object through peeling off the resin sheet from the peeling origin point.

10 Claims, 5 Drawing Sheets

PEELING METHOD OF RESIN SHEET

BACKGROUND OF THE INVENTION

Field of the Invention

The present invention relates to a peeling method of a resin sheet.

Description of the Related Art

Processing techniques are known by which a plate-shaped workpiece such as a semiconductor wafer, a resin package substrate, a glass substrate, or a ceramic substrate is ground by a grinding wheel to be thinned or is divided by a cutting blade or laser beam. In such processing, an adhesive sheet for protecting particularly a surface on which devices are formed in the workpiece is stuck to the surface of the workpiece. The adhesive sheet is in tight contact with the workpiece by a strong adhesive layer so as not to peel off in the processing. In peeling off the adhesive sheet, a technique is used in which a thermocompression sheet for peeling is strongly fixed to the adhesive sheet and the adhesive sheet is peeled off from the workpiece by pulling the thermocompression sheet (for example, refer to Japanese Patent Laid-Open No. 2012-028478).

SUMMARY OF THE INVENTION

However, in the method like the above-described one, the thermocompression sheet, i.e., another consumable component, is necessary, which leads to cost increase. A technique has also been developed in which, without using the thermocompression sheet, a claw part is inserted between a resin sheet and a workpiece and the resin sheet is peeled off. However, there is a problem that it is difficult to allow the entry of the claw and form a peeling origin point if the resin sheet is strongly in tight contact with the workpiece.

Thus, an object of the present invention is to provide a peeling method of a resin sheet by which a peeling origin point of the resin sheet in tight contact with a plate-shaped object can be formed easily.

In accordance with an aspect of the present invention, there is provided a peeling method of a resin sheet for peeling off the resin sheet from a plate-shaped object to which the resin sheet is stuck. The peeling method includes a resin sheet heating step of heating an end part of the resin sheet of the plate-shaped object to which the resin sheet is stuck to turn up the resin sheet from the end part and form a peeling origin point and a resin sheet removal step of removing the resin sheet from the plate-shaped object through peeling off the resin sheet from the peeling origin point.

Preferably, the resin sheet is a resin sheet in which an adhesive material layer is absent. Preferably, the resin sheet has a region in which an adhesive material layer is absent in a region stuck to the plate-shaped object. Preferably, the resin sheet is heated through the plate-shaped object in the resin sheet heating step.

According to the present invention, the peeling origin point of the resin sheet in tight contact with the plate-shaped object can be formed easily.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment of the present invention will be described in detail below with reference to the drawings. The present invention is not limited by contents described in the following embodiment. Furthermore, what can be envisaged easily by those skilled in the art and what are substantially the same are included in constituent elements described below. Moreover, configurations described below can be combined as appropriate. In addition, various kinds of omission, replacement, or change of configurations can be executed without departing from the gist of the present invention.

Figure 1:
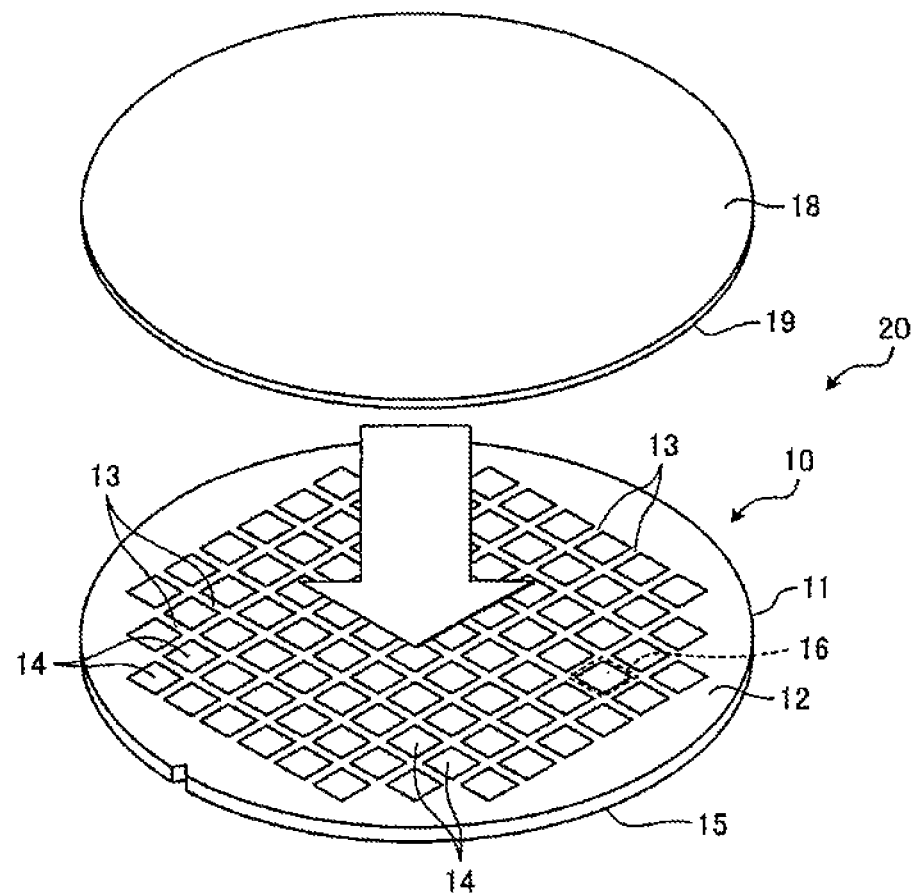
FIG. 1 is an exploded perspective view of a sheet-applied plate-shaped object used in a peeling method of a resin sheet according to an embodiment of the present invention.
Figure 2:
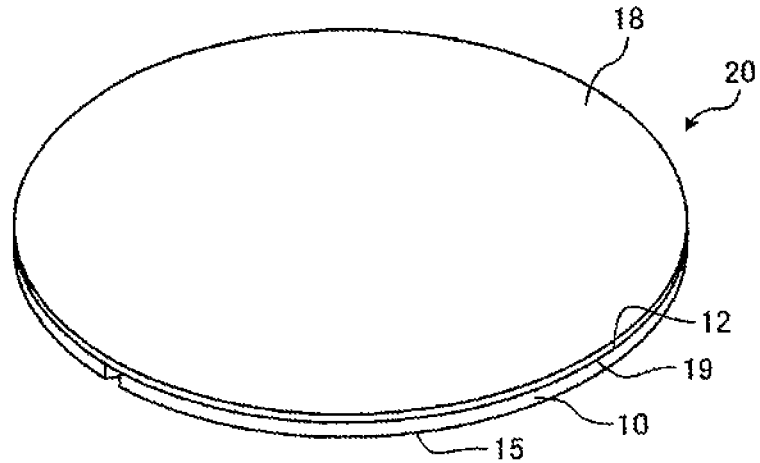
FIG. 2 is a perspective view of the sheet-applied plate-shaped object illustrated in FIG. 1.
Figure 3:
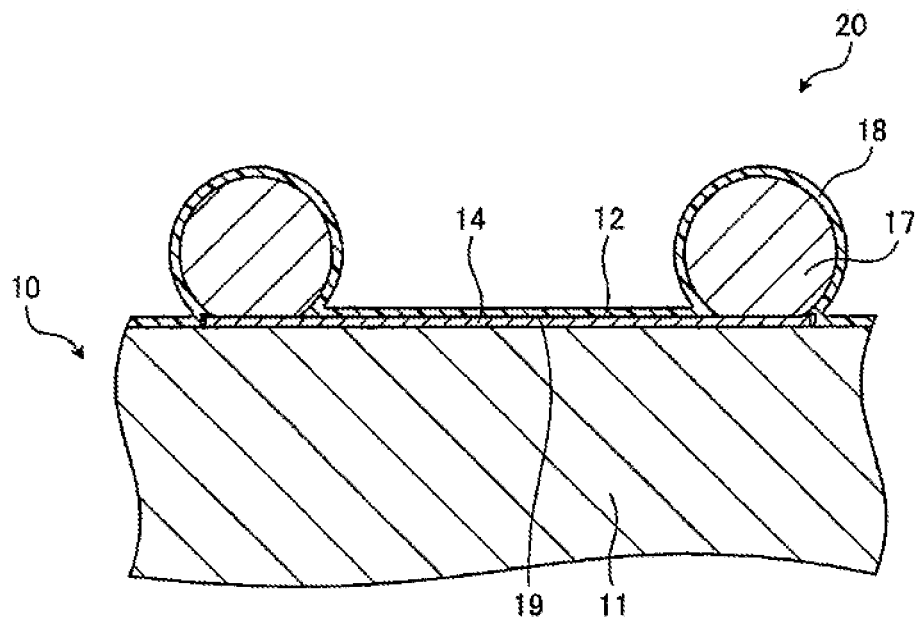
FIG. 3 is a sectional view illustrating part of FIG. 2 in a magnified manner.

A peeling method of a resin sheet 18 according to the embodiment will be described based on the drawings. First, a description will be made about the configuration of a sheet-applied plate-shaped object 20 used in the peeling method of the resin sheet 18 according to the embodiment. FIG. 1 is an exploded perspective view of the sheet-applied plate-shaped object 20 used in the peeling method of the resin sheet 18 according to the embodiment. FIG. 2 is a perspective view of the sheet-applied plate-shaped object 20 illustrated in FIG. 1. FIG. 3 is a sectional view illustrating part of FIG. 2 in a magnified manner. The sheet-applied plate-shaped object 20 includes a plate-shaped object 10 and the resin sheet 18.

The plate-shaped object 10 is a circular-disc-shaped wafer such as a semiconductor wafer or an optical device wafer having a substrate 11 composed of silicon, sapphire, silicon carbide (SiC), gallium arsenide, or the like. The plate-shaped object 10 has plural planned dividing lines 13 formed in a front surface 12 of the substrate 11 and devices 14 formed in the respective regions marked out by the plural planned dividing lines 13 that intersect in a lattice manner. A surface of the substrate 11 located on the opposite side to the front surface 12 on which the devices 14 are formed is defined as a back surface 15. The plate-shaped object 10 becomes chips 16 by being divided along the planned dividing lines 13. In the embodiment, as illustrated in FIG. 3, plural electrode bumps 17 are mounted on the front surface 12 of the plate-shaped object 10. However, the electrode bumps 17 do not have to be mounted in the present invention. The electrode bumps 17 protrude from the front surface 12 of the devices 14. The plate-shaped object 10 has concavities and convexities due to the mounting of the electrode bumps 17 on the front surface 12 of the devices 14.

The resin sheet 18 is what protects the devices 14 by being stuck to the front surface 12 of the plate-shaped object 10, with one surface thereof used as a stuck surface 19. The resin sheet 18 is formed into a circular disc shape with the same diameter as the plate-shaped object 10. The resin sheet 18 is a synthetic resin having thermoplasticity. The resin sheet 18 is composed of a polyolefin resin, for example. In the embodiment, the resin sheet 18 is a resin sheet in which an adhesive material layer of a glue or the like is absent in the region stuck to the plate-shaped object 10. In the embodiment, the resin sheet 18 is a resin sheet in which an adhesive material layer of a glue or the like is absent. If the resin sheet 18 does not have an adhesive layer of a glue or the like, for example, the resin sheet 18 is stuck to the plate-shaped object 10 by being brought into tight contact with the plate-shaped object 10 while being stretched through being given a tensile force in the surface direction and in a radial manner by a roller, pressing component, or the like.

In the embodiment, the resin sheet 18 is formed only of a base layer composed of a thermoplastic resin such as a polyolefin resin. However, in the present invention, the resin sheet 18 may include the base layer and the adhesive material layer. For example, the resin sheet 18 may include the adhesive material layer and the base layer disposed in a region other than the region stuck to the plate-shaped object 10 or may include the adhesive material layer stuck to the plate-shaped object 10 and the base layer.

Figure 4:
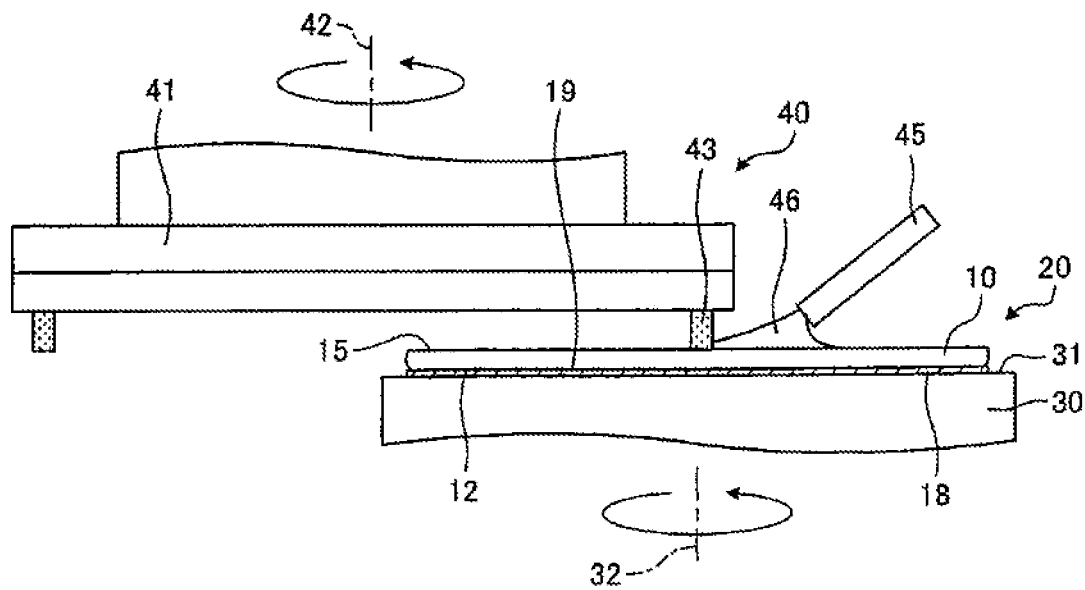
FIG. 4 is a partially sectional side view illustrating a processing example of the sheet-applied plate-shaped object illustrated in FIG. 1.

Next, one example of processing in which the sheet-applied plate-shaped object 20 is employed as a processing target will be described. FIG. 4 is a partially sectional side view illustrating a processing example of the sheet-applied plate-shaped object illustrated in FIG. 1. The one example illustrated in FIG. 4 is grinding processing in which the plate-shaped object 10 is ground from the back surface 15 to be thinned to a predetermined thickness by a grinding unit 40.

In the grinding processing, first, the sheet-applied plate-shaped object 20 is placed in such a manner that the side of the front surface 12 of the plate-shaped object 10 is opposed to a holding surface 31 of a chuck table 30. The plate-shaped object 10 is sucked and held by the holding surface 31 of the chuck table 30 with the intermediary of the resin sheet 18 stuck to the front surface 12. The devices 14 formed on the front surface 12 of the plate-shaped object 10 are protected from damage due to adhesion or contact of a foreign substance by the resin sheet 18.

In the grinding processing, next, the chuck table 30 is rotated around an axis center 32 and a grinding wheel 41 of the grinding unit 40 is rotated around an axis center 42. In the grinding processing, next, a grinding abrasive stone 43 of the grinding wheel 41 is brought close to the chuck table 30 at a predetermined feed rate while grinding water 46 is supplied by a grinding water supply unit 45. When the grinding abrasive stone 43 gets contact with the back surface 15 of the plate-shaped object 10, the grinding abrasive stone 43 grinds the side of the back surface 15 of the plate-shaped object 10. When the plate-shaped object 10 has been thinned to the predetermined thickness by the grinding unit 40, the suction holding by the chuck table 30 is released and the grinding processing is ended.

Figure 5:
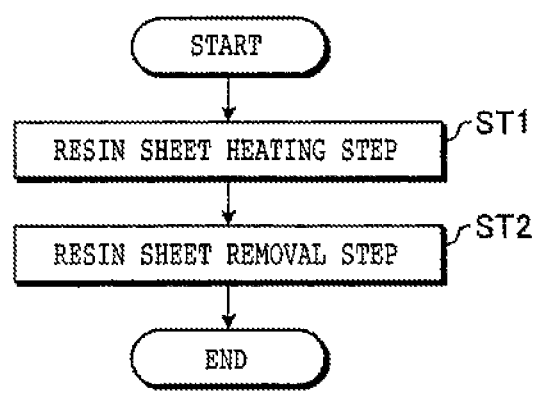
FIG. 5 is a flowchart illustrating a flow of the peeling method of the resin sheet according to the embodiment.

Next, the peeling method of the resin sheet 18 according to the embodiment will be described. FIG. 5 is a flowchart illustrating a flow of the peeling method of the resin sheet 18 according to the embodiment. The peeling method of the resin sheet 18 is a method for peeling off the resin sheet 18 from the plate-shaped object 10 illustrated in FIG. 2 and FIG. 3, to which the resin sheet 18 is stuck, and includes a resin sheet heating step ST1 and a resin sheet removal step ST2 as illustrated in FIG. 5.

First, the resin sheet heating step ST1 will be described. The resin sheet heating step ST1 is a step of heating an end part of the resin sheet 18 of the plate-shaped object 10 to which the resin sheet 18 is stuck to turn up the resin sheet 18 from the end part and form a peeling origin point 21.

Figure 6:
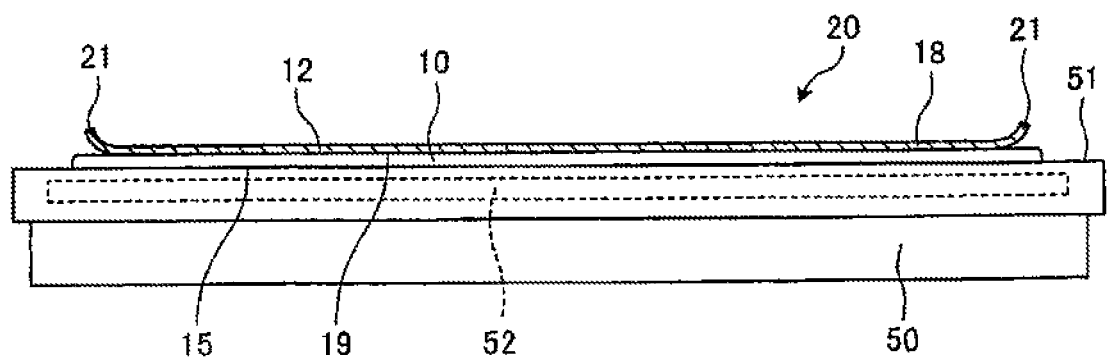
FIG. 6 is a partially sectional side view illustrating one example of a resin sheet heating step in the peeling method of the resin sheet illustrated in FIG. 5.

FIG. 6 is a partially sectional side view illustrating one example of the resin sheet heating step ST1 in the peeling method of the resin sheet 18 illustrated in FIG. 5. In the one example illustrated in FIG. 6, in the resin sheet heating step ST1, first, the sheet-applied plate-shaped object 20 is placed on a placement surface 51 of a heat table 50. At this time, the sheet-applied plate-shaped object 20 is placed in such a manner that the side of the back surface 15 of the plate-shaped object 10 gets contact with the placement surface 51 and the resin sheet 18 is set on the upper surface side. In the heat table 50, a heat generating part 52 is disposed at a position at which the heat generating part 52 can heat at least a circumferential edge part of the sheet-applied plate-shaped object 20. In the one example illustrated in FIG. 6, the heat generating part 52 is disposed across the whole of the surface on which the sheet-applied plate-shaped object 20 is placed.

In the one example illustrated in FIG. 6, in the resin sheet heating step ST1, next, the heat generating part 52 is heated through application of a voltage to the heat generating part 52 of the heat table 50, or the like. By heating the heat generating part 52, the placement surface 51 of the heat table 50 is heated. The heat table 50 heats the sheet-applied plate-shaped object 20 by a rise in the temperature of the placement surface 51. The heat table 50 heats the resin sheet 18 through the plate-shaped object 10. If the resin sheet 18 is a polyolefin resin sheet, the surface temperature of the placement surface 51 is equal to or higher than 80° C. and it is preferable for the surface temperature to be equal to or higher than 110° C.

Because being thermoplastic, the resin sheet 18 of the sheet-applied plate-shaped object 20 softens and gets deformed due to being heated. In contrast, the plate-shaped object 10, which is a wafer, has a lower linear expansion coefficient than the resin sheet 18 and therefore deformation thereof due to the heating is smaller. Due to this, the heated and deformed resin sheet 18 turns up from the end part that is the circumferential edge part with respect to the plate-shaped object 10. The peeling origin point 21 is formed at the end part of the resin sheet 18.

Figure 7:
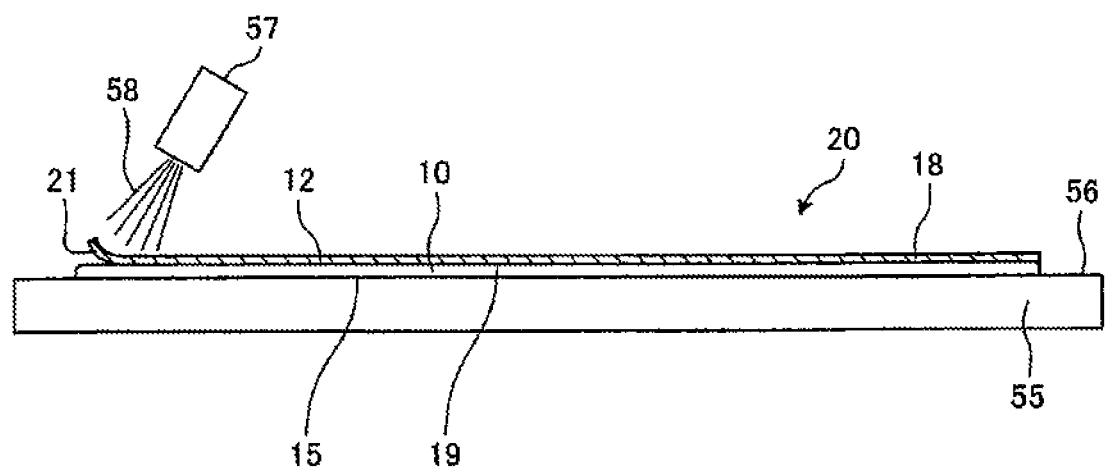
FIG. 7 is a partially sectional side view illustrating another example of the resin sheet heating step in the peeling method of the resin sheet illustrated in FIG. 5.

FIG. 7 is a partially sectional side view illustrating another example of the resin sheet heating step ST1 in the peeling method of the resin sheet 18 illustrated in FIG. 5. In the one example illustrated in FIG. 7, in the resin sheet heating step ST1, first, the sheet-applied plate-shaped object 20 is placed on a placement surface 56 of a table 55. At this time, the sheet-applied plate-shaped object 20 is placed in such a manner that the side of the back surface 15 of the plate-shaped object 10 gets contact with the placement surface 56 and the resin sheet 18 is set on the upper surface side.

In the one example illustrated in FIG. 7, in the resin sheet heating step ST1, next, the sheet-applied plate-shaped object 20 is heated by a hot wind 58 of a hot wind dryer 57. In the resin sheet heating step ST1, it is preferable to orient the hot wind 58 of the hot wind dryer 57 toward an end part that is a circumferential edge part in the sheet-applied plate-shaped object 20. The heated end part of the resin sheet 18 softens and gets deformed. In the resin sheet 18, the heated and deformed end part turns up with respect to the plate-shaped object 10. The peeling origin point 21 is formed at the end part of the resin sheet 18.

Although the two heating methods are exemplified in the above description, the heating method in the resin sheet heating step ST1 is not particularly limited as long as it can at least heat an end part of the resin sheet 18. The heating method may be a method using electromagnetic waves such as far infrared rays, for example.

Next, the resin sheet removal step ST2 will be described. The resin sheet removal step ST2 is a step of removing the resin sheet 18 from the plate-shaped object 10 by peeling off the resin sheet 18 from the peeling origin point 21 after the resin sheet heating step ST1. In the following, a description will be made based on the premise that the resin sheet removal step ST2 is executed after the resin sheet heating step ST1 in the one example illustrated in FIG. 6. However, the resin sheet removal step ST2 may be executed after the resin sheet heating step ST1 in the other example illustrated in FIG. 7.

Figure 8:
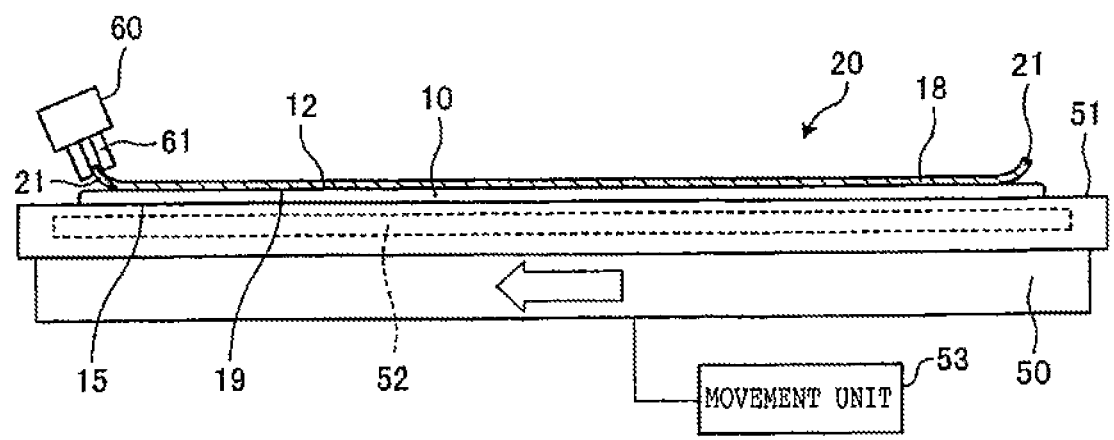
FIG. 8 is a partially sectional side view illustrating one example of a resin sheet removal step in the peeling method of the resin sheet illustrated in FIG. 5.

FIG. 8 is a partially sectional side view illustrating one example of the resin sheet removal step ST2 in the peeling method of the resin sheet 18 illustrated in FIG. 5. In the one example illustrated in FIG. 8, in the resin sheet removal step ST2, first, the end part that is the peeling origin point 21 of the resin sheet 18, formed in the resin sheet heating step ST1, is gripped by a gripping part 61 of a removing unit 60.

In the one example illustrated in FIG. 8, in the resin sheet removal step ST2, next, the heat table 50 is moved by a movement unit 53 in a horizontal direction parallel to the placement surface 51 and in a direction illustrated by an arrow in FIG. 8 from the center of the placement surface 51 toward the part gripped by the gripping part 61 in the peeling origin point 21. The gripping part 61 of the removing unit 60 relatively moves from the gripped part of the resin sheet 18 toward the center of the sheet-applied plate-shaped object 20 and thereby peels off the remaining stuck surface 19 of the resin sheet 18 from the front surface 12 of the plate-shaped object 10 with use of the peeling origin point 21 as the point of origin. Thereby, the resin sheet 18 is removed from the plate-shaped object 10.

Figure 9:
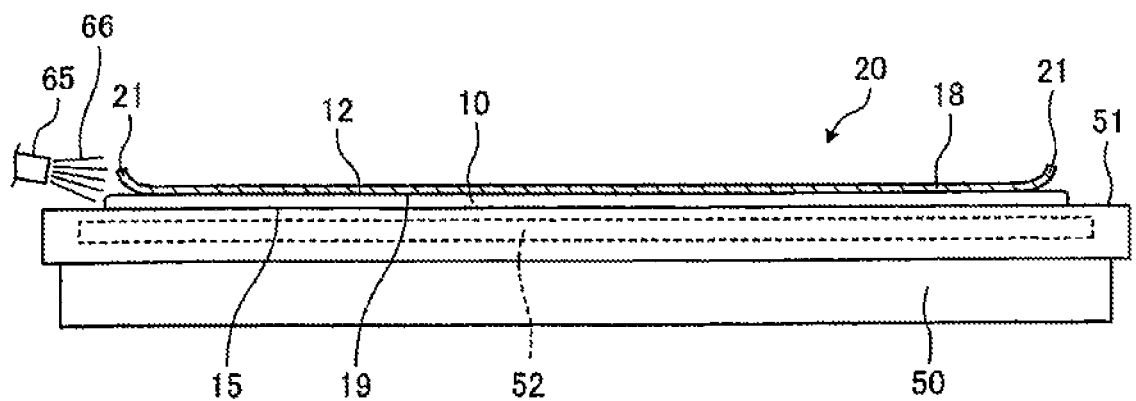
FIG. 9 is a partially sectional side view illustrating another example of the resin sheet removal step in the peeling method of the resin sheet illustrated in FIG. 5.

FIG. 9 is a partially sectional side view illustrating another example of the resin sheet removal step ST2 in the peeling method of the resin sheet 18 illustrated in FIG. 5. In the one example illustrated in FIG. 9, in the resin sheet removal step ST2, air 66 of an air jetting unit 65 is jetted from a lateral side of the sheet-applied plate-shaped object 20 placed on the placement surface 51 of the heat table 50 toward the peeling origin point 21. The air jetting unit 65 supplies the air 66 between the plate-shaped object 10 and the resin sheet 18 and thereby peels off the remaining stuck surface 19 of the resin sheet 18 from the front surface 12 of the plate-shaped object 10 with use of the peeling origin point 21 as the point of origin. Thereby, the resin sheet 18 is removed from the plate-shaped object 10.

Figure 10:
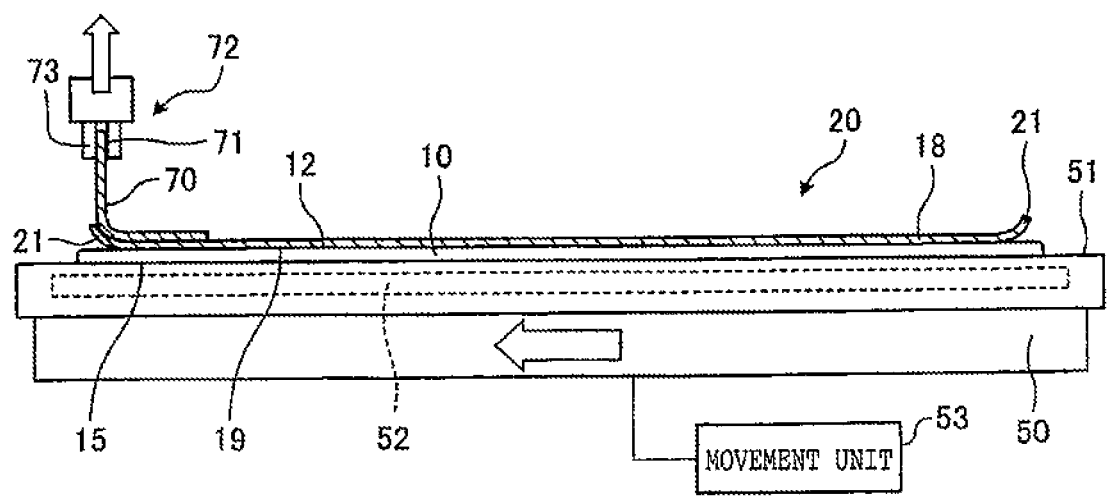
FIG. 10 is a partially sectional side view illustrating further another example of the resin sheet removal step in the peeling method of the resin sheet illustrated in FIG. 5.

FIG. 10 is a partially sectional side view illustrating further another example of the resin sheet removal step ST2 in the peeling method of the resin sheet 18 illustrated in FIG. 5. In the one example illustrated in FIG. 10, in the resin sheet removal step ST2, first, a tape 70 for peeling is stuck to the end part that is the peeling origin point 21 in the resin sheet 18, formed in the resin sheet heating step ST1. At this time, the tape 70 for peeling is stuck in such a manner that one end 71 of the tape 70 for peeling protrudes from the circumferential edge of the resin sheet 18 to the outside. In the one example illustrated in FIG. 10, in the resin sheet removal step ST2, next, the one end 71 of the tape 70 for peeling is gripped by a gripping part 73 of a removing unit 72.

In the one example illustrated in FIG. 10, in the resin sheet removal step ST2, next, the heat table 50 is moved by the movement unit 53 in a horizontal direction parallel to the placement surface 51 and in a direction illustrated by an arrow in FIG. 10 from the center of the placement surface 51 toward the part gripped by the gripping part 73 in the tape 70 for peeling stuck to the peeling origin point 21. In addition, the removing unit 72 is moved in the direction perpendicular to the placement surface 51 and upward. The gripping part 73 of the removing unit 72 relatively moves from the part to which the gripped tape 70 for peeling is stuck in the resin sheet 18 toward the center of the sheet-applied plate-shaped object 20 and thereby peels off the remaining stuck surface 19 of the resin sheet 18 from the front surface 12 of the plate-shaped object 10 with use of the peeling origin point 21 as the point of origin. Thereby, the resin sheet 18 is removed from the plate-shaped object 10.

Although the three removal methods are exemplified in the above description, the removal method in the resin sheet removal step ST2 is not particularly limited as long as it is a method that can execute peeling with gripping of the peeling origin point 21 of the resin sheet 18 or promote peeling of the resin sheet 18 from the peeling origin point 21. In the resin sheet removal step ST2, heating of the resin sheet 18 may be continued from the resin sheet heating step ST1.

As described above, in the peeling method of the resin sheet 18 according to the embodiment, the resin sheet 18 is removed from the plate-shaped object 10 by peeling off the resin sheet 18 from the peeling origin point 21 formed at an end part of the resin sheet 18. The peeling origin point 21 is formed by heating the end part of the resin sheet 18. Due to the thermoplasticity of the resin sheet 18 and the difference in the linear expansion coefficient from the plate-shaped object 10, the phenomenon in which the resin sheet 18 naturally turns up from the end part occurs when the resin sheet 18 is heated. That is, by heating at least the end part of the resin sheet 18, the end part, which is the circumferential edge of the resin sheet 18, can be turned up. Therefore, the peeling origin point 21 can be formed easily even in the resin sheet 18 that is strongly in tight contact with the plate-shaped object 10. Due to the formation of the peeling origin point 21, the remaining stuck surface 19 of the resin sheet 18 can be peeled off easily from the front surface 12 of the plate-shaped object 10 with use of the peeling origin point 21 as the point of origin.

Moreover, in the case of the resin sheet 18 in which an adhesive layer of a glue or the like is absent, a tensile force in the surface direction and in a radial manner is given to the resin sheet 18 when the resin sheet 18 is stuck. This provides an effect that the end part of the resin sheet 18 turns up more readily due to heating. Furthermore, with the resin sheet 18 in which an adhesive layer of a glue or the like is absent, for example, control of the sticking force is difficult compared with an adhesive sheet including an ultraviolet (UV)-curable glue layer cured by UV, or the like, and therefore the peeling method of the resin sheet according to the present invention is more useful.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A peeling method of a resin sheet for peeling off the resin sheet from an object to which the resin sheet is stuck, the peeling method comprising:
   a resin sheet heating step of heating an end part of the resin sheet on the object to which the resin sheet is stuck to turn up the resin sheet from the end part and form a peeling origin point; and
   a resin sheet removal step of removing the resin sheet from the object through peeling off the resin sheet from the peeling origin point,
   wherein the resin sheet does not have an adhesive layer.

2. The peeling method of a resin sheet according to claim 1, wherein the resin heating step includes heating the resin sheet through the object.

3. The peeling method of a resin sheet according to claim 1, wherein the resin heating step includes placing the object on a heat table with a heat generating part and heating the resin sheet through the object with heat generated by the heat generating part.

4. The peeling method of a resin sheet according to claim 1, wherein the resin heating step includes heating the resin sheet with hot wind generated by a hot wind dryer.

5. A peeling method of a resin sheet for peeling off the resin sheet from an object to which the resin sheet is stuck, the peeling method comprising:
   a resin sheet heating step of heating an end part of the resin sheet on the object to which the resin sheet is stuck to turn up the resin sheet from the end part and form a peeling origin point; and
   a resin sheet removal step of removing the resin sheet from the object through peeling off the resin sheet from the peeling origin point,
   wherein the resin sheet has a region that does not have an adhesive material layer in a region stuck to the object.

6. The peeling method of a resin sheet according to claim 5, wherein the resin heating step includes placing the object on a heat table with a heat generating part and heating the resin sheet through the object with heat generated by the heat generating part.

7. The peeling method of a resin sheet according to claim 5, wherein the resin heating step includes heating the resin sheet with hot wind generated by a hot wind dryer.

8. A peeling method of a resin sheet for peeling off the resin sheet from an object to which the resin sheet is stuck, the peeling method comprising:
   a resin sheet heating step of heating an end part of the resin sheet on the object to which the resin sheet is stuck to turn up the resin sheet from the end part and form a peeling origin point; and
   a resin sheet removal step of directing air between the resin sheet and the object at the peeling origin point to remove the resin sheet from the object,
   wherein the resin sheet does not have an adhesive layer.

9. The peeling method of a resin sheet according to claim 8, wherein the resin heating step includes heating the resin sheet through the object.

10. The peeling method of a resin sheet according to claim 8, wherein the resin heating step includes placing the object on a heat table with a heat generating part and heating the resin sheet through the object with heat generated by the heat generating part.

* * * * *